(12) United States Patent
Furukawa et al.

(10) Patent No.: US 6,207,493 B1
(45) Date of Patent: Mar. 27, 2001

(54) FORMATION OF OUT-DIFFUSED BITLINE BY LASER ANNEAL

(75) Inventors: Toshiharu Furukawa, Essex Junction; Mark C. Hakey; Steven J. Holmes, both of Milton; David V. Horak, Essex Junction, all of VT (US); Thomas S. Kanarsky, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/136,586

(22) Filed: Aug. 19, 1998

(51) Int. Cl.[7] ............................................... H01L 21/8242
(52) U.S. Cl. ........................ 438/246; 438/262; 438/561
(58) Field of Search ................................. 438/246, 308, 438/389, 392, 558, 561, 562, 563, 564

(56) References Cited

U.S. PATENT DOCUMENTS

| | | |
|---|---|---|
| 4,794,091 | 12/1988 | Lynch . |
| 4,820,652 | 4/1989 | Hayashi . |
| 4,994,409 * | 2/1991 | Yoon et al. . |
| 5,618,741 | 4/1997 | Young et al. . |
| 5,663,077 | 9/1997 | Adachi et al. . |

FOREIGN PATENT DOCUMENTS

| | | |
|---|---|---|
| 62-268158 | 11/1987 | (JP) . |
| 2-94436 | 4/1990 | (JP) . |

OTHER PUBLICATIONS

IBM Technical Disclosure Bulletin, "Programmable Read–Only Memory Programmed By Laser Means", vol. 24, No. 7A, pp. 3490–3491 (Dec. 1981).

IBM Technical Disclosure Bulletin, "High Density Vertical Dram Cell", vol. 29, No. 5, p. 2335–2339 (Oct. 1986).

* cited by examiner

Primary Examiner—Tuan H. Nguyen
(74) Attorney, Agent, or Firm—Scully, Scott, Murphy & Presser; William D. Sabo, Esq.

(57) ABSTRACT

The present invention provides methods of forming an out-diffused bitline in a semiconductor substrate by utilizing a laser annealing step wherein the dopant material in the trench region is out-diffused into the semiconductor substrate. The out-diffused bitline can also be formed utilizing an ion implantation step.

21 Claims, 8 Drawing Sheets

US 6,207,493 B1

FORMATION OF OUT-DIFFUSED BITLINE BY LASER ANNEAL

FIELD OF THE INVENTION

The present invention relates to methods of fabricating a vertical semiconductor memory structure and, in particular to methods of fabricating a vertical gate semiconductor memory structure wherein the bitline of the structure is buried beneath the transfer gate. More specifically, the present invention provides methods of manufacturing such memory structures by utilizing a laser annealing step to out-diffuse dopant material which is present inside of the trench into the semiconductor substrate.

BACKGROUND OF THE INVENTION

As is known to those skilled in the art, a semiconductor memory device such as a dynamic random access memory (DRAM) cell comprises a plurality of memory cells which are used to store a large quantity of information. Each memory cell includes a capacitor for storing electric charge and a field effect transistor for opening and closing charge and discharge passages of the capacitor. The number of bits on DRAM chips has been increasing by approximately 4× every three years; this has been achieved by reducing the cell size. Unfortunately, the smaller cell size also results in less area to fabricate the capacitor.

In early DRAM generations, the storage electrode of each capacitor which constitutes each memory cell, together with each corresponding field effect transistor, was formed in the shape of a planar plate over the field effect transistor. Because of this planar plate shape, the storage electrode surface area was abruptly reduced as the cell size decreased. In this regard, conventional methods for fabricating memory cells have difficulties in increasing the surface area of storage electrodes because they involve the formation of a storage electrode having a planar plate shape.

In order to maintain increased electrode area while reducing the size of the memory cells, vertical gate (or trench) semiconductor memory structures have been employed. W. Hwang, et al. "High Density Vertical DRAM Cell", IBM Technical Disclosure Bulletin, Vol. 29, No. 5, October 1986, pp. 2335–2339 discloses a typical prior art high density vertical DRAM cell wherein the transfer device is oriented in the vertical direction and is positioned over the trench storage capacitor. A shallow trench filled with polysilicon or polycide serves as the MOS transfer device gate. A representation of the high density vertical trench DRAM cell disclosed in W. Hwang, et al. is reproduced herein in FIG. 1. Specifically, FIG. 1 comprises a semiconductor wafer containing a p$^+$ substrate 10 and a p epitaxial layer 12. The vertical DRAM cell also contains trenches 14 that contain an oxide/nitride/oxide liner 16 and n$^+$ polysilicon 18. Atop of each trench 14 is crystalline n$^+$ layer 20 and wordline 22 composed of n$^+$ polysilicon positioned between each trench. A p-type epitaxial layer 24 is located on either side of wordline 22 and is formed on top of p epitaxial layer 12 and n$^+$ polysilicon 18. The structure further includes bitlines 26 located on either sides of wordline 22 and field oxide regions 28.

In some instances, it is desirable to bury the bitline below the transfer gate, see for example, co-assigned U.S. application Ser. No. 08/787,418, filed Jan. 22, 1997. This bitline is often times formed in prior art processes by etching a trench within a thin film of As-doped oxide, blanket patterning a resist film in the bottom of the trench, etching the oxide film from the sidewalls of the trench where the transfer device will be, and annealing the substrate to drive the As dopant into the silicon wafer so as to form a buried bitline.

A major problem with this prior art approach is that the foregoing type of patterning produces conductive loops in the bitline effectively creating a common source. If a design will use uniquely addressed bitlines as also described in the above co-pending U.S. patent application Ser. No. 08/787,418, the loops need to be trimmed by a resist masking process.

One example of such a trim process is shown top-down in the sequence of FIGS. 2(a)–(d). In FIG. 2(a), the rows of pillars 2 are surrounded by deposition of arsenic containing glass 4. A lithographic mask 6 is printed in the resist (see, FIG. 2(b)) exposing only the ends of the loops to the isotropic etch of the dopant source resulting in the structure shown in FIG. 2(c). The high temperature drive will then diffuse arsenic into the silicon pillar forming two discrete diffused bitlines 8 on each side of the pillar as is shown in FIG. 2(d). Moreover, this prior art approach provides a poor control of channel doping with non-vertical pillars. In view of these drawbacks in prior art manufacturing of buried bitlines, there is a continued need to develop a new method of forming a buried bitline in a vertical semiconductor memory cell that does not have any conductive loops associated therewith. Such a method would eliminate the need of an extra processing step, in this case trimming via resist patterning, that is required by prior art processes to eliminate the conductive loops.

SUMMARY OF THE INVENTION

One object of the present invention is to provide a method of fabricating a vertical memory cell that contains a buried bitline.

Another object of the present invention is to provide a method of forming a buried bitline in a vertical memory cell that does not contain any conductive loops associated therewith.

A still further object of the present invention is to provide a method whereby a buried bitline can be formed in a semiconductor memory cell such that extra processing steps such as trimming are totally eliminated; therefore providing a simple, yet cost effective method of forming vertical memory cells which contain a buried bitline below the transfer gate.

These and other objects and advantages can be achieved in the present invention by utilizing a laser annealing step to out-diffuse the bitline material, e.g. dopant, so as to provide a bitline that is below the transfer gate. Specifically, in one embodiment of the present invention there is provided a method of forming a vertical memory cell wherein the bitline is buried below the transfer gate of said cell, said method comprising the steps of:

(a) forming at least one trench region in a semiconductor substrate;

(b) forming a conformal layer in said at least one trench region and on exposed surfaces of said semiconductor substrate, wherein said conformal layer is a dopant source material that comprises a dopant carrying material and a dopant element that is capable of being released, i.e. out-diffused, upon exposure to laser light;

(c) depositing a recessable material on the structure provided in step (b);

(d) recessing some, but not all, of said recessable, material and said conformal dopant source material leaving a masked region of said recessable material on a layer of said conformal dopant source material in said at least one trench region;

(e) stripping the masked region of said recessable material;

(f) laser annealing the structure provided in step (e) to cause out-diffusion of the dopant element from the remaining recessed dopant source material into said semiconductor substrate;

(g) stripping any remaining recessed source material from said at least one trench region; and (h) etching said out-diffused dopant to provide a buried bitline in said semiconductor substrate.

In another embodiment of the present invention, the dopant source material in the trench can be converted to an oxide during the laser annealing step by irradiating the same in the presence of oxygen. This embodiment of the present invention is particularly useful when a plasma polymerized methylsilane is used as the dopant carrying material. Additionally, in some instances, it may be easier to strip the oxide rather than the dopant source material formed in the trench.

In yet another embodiment of the present invention, the buried bitline is formed by a method which comprises the following steps:

(a) forming at least one trench region in a semiconductor substrate;

(b) implanting an ion capable of rendering the bottom of said trench amorphous;

(c) laser annealing the structure provided in step (b) in the presence of a gaseous dopant element under conditions effective to cause formation of a doped region and subsequent out-diffusion of said dopant element from said doped region into said semiconductor substrate; and (d) etching said out-diffused material to provide a buried bitline in the semiconductor substrate.

DETAILED DESCRIPTION OF THE INVENTION

Figure 1:
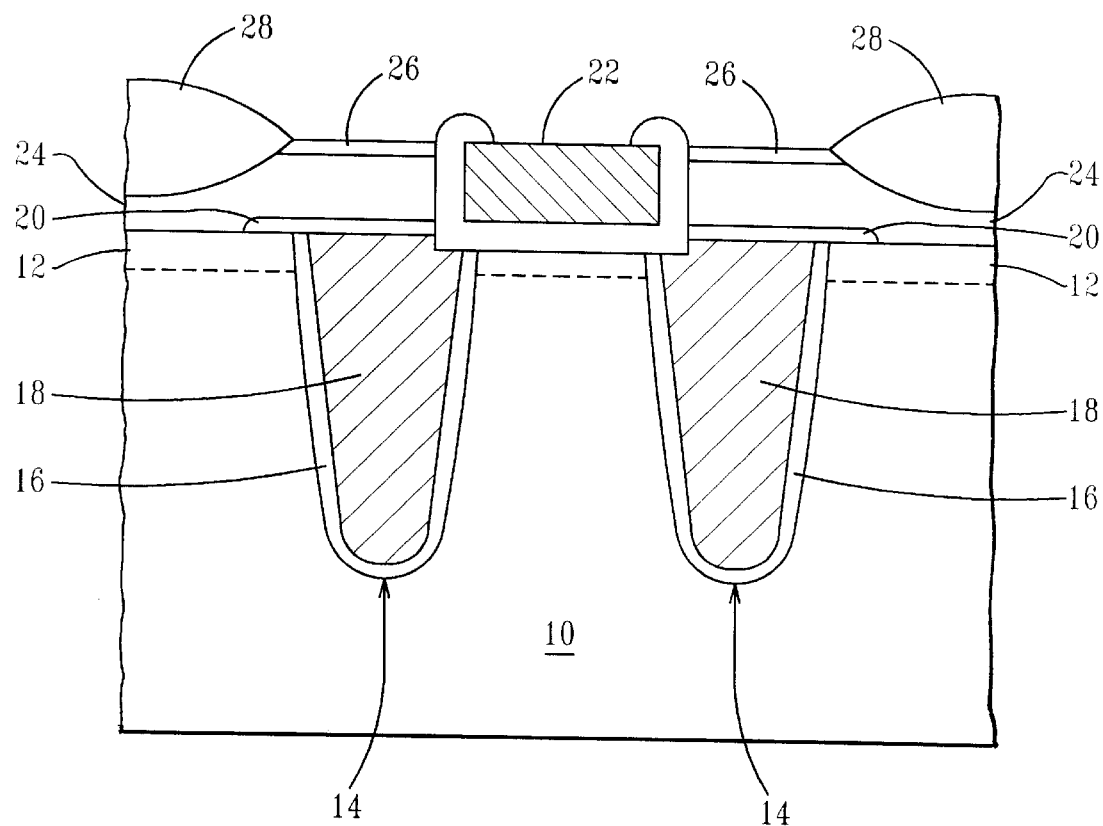
FIG. 1 is a cross-sectional view of a prior art high density vertical trench DRAM cell.
Figure 2A:
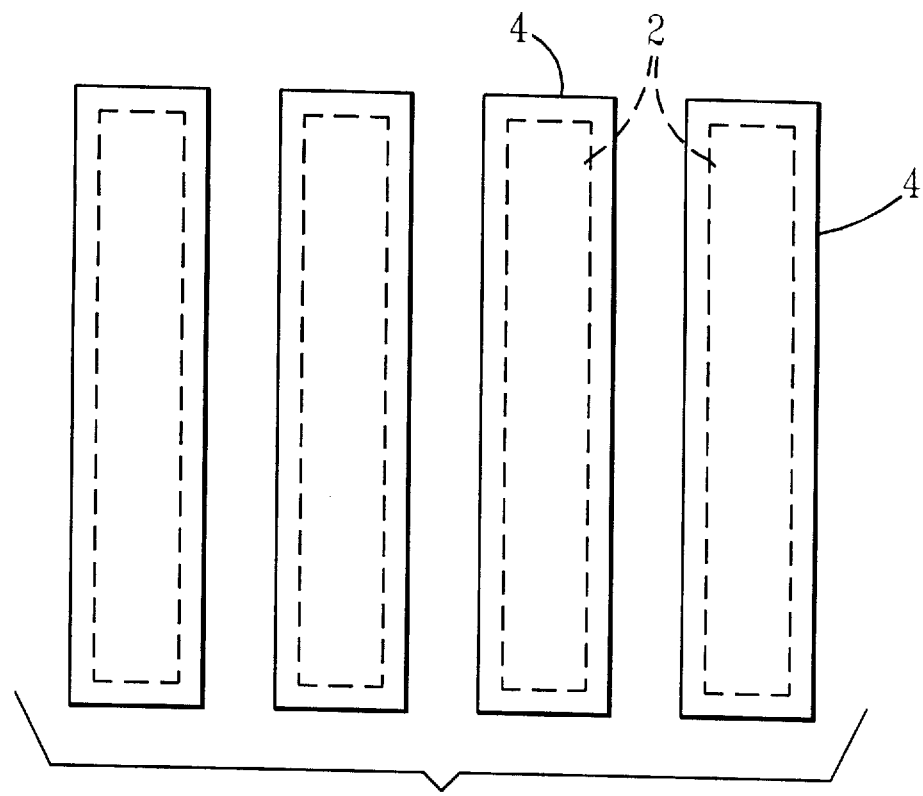
FIGS. 2(a)–2(d) are top-bottom views showing the prior art process of trimming buried bitlines.
Figure 2B:
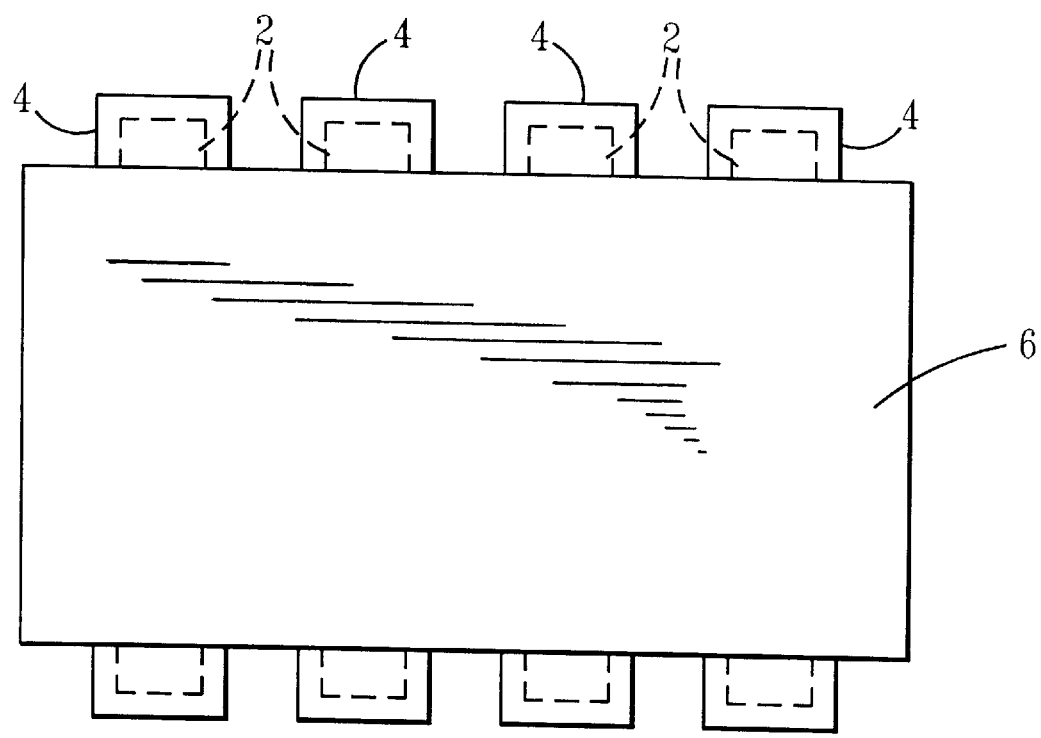
Figure 2C:
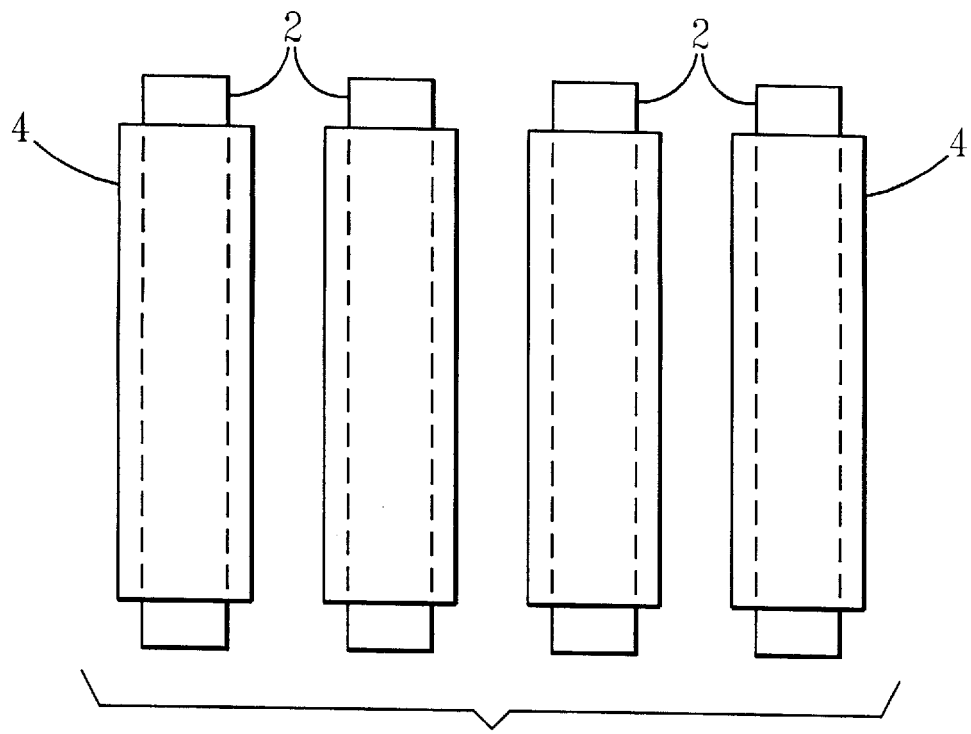
Figure 2D:
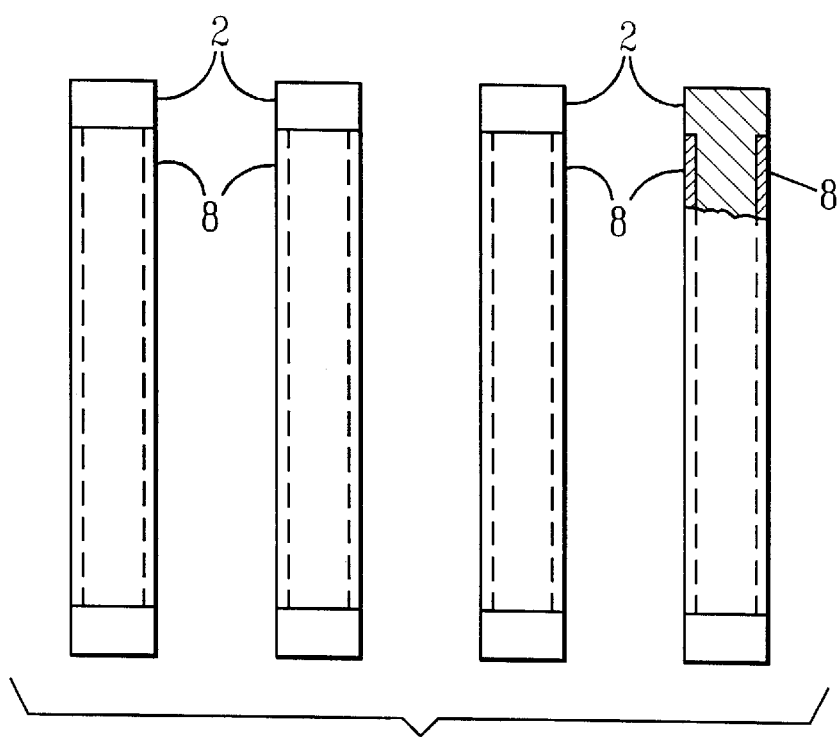

The present invention will now be described in more detail with reference to the accompanying drawings wherein like reference numerals are used for like or corresponding elements of the drawings. It is noted that the method of the present invention which comprises forming a conformal layer of dopant source material over the entire structure, laser annealing and subsequent stripping will be described in detail first. The method of the present invention involving ion implantation and laser annealing will be described later in greater detail.

Figure 3A:
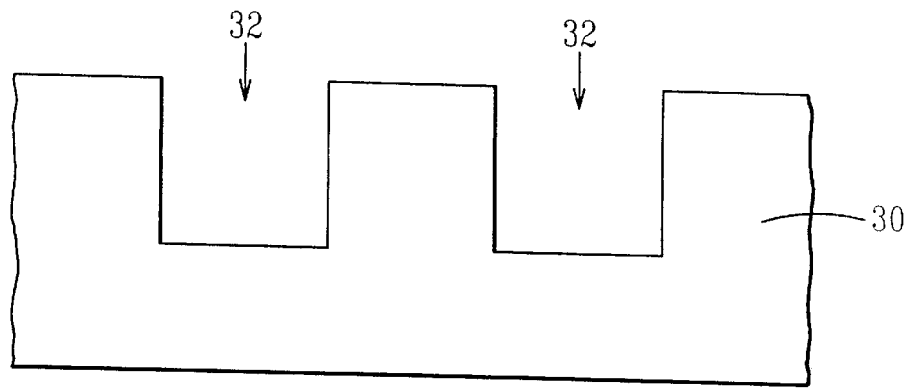
FIGS. 3(a)–3(g) are cross-sectional views of a typically vertical memory cell structure that can be fabricated by utilizing one of the methods of the present invention.

Referring first to FIG. 3(a), there is shown a semiconductor substrate 30 which contains trench regions 32 formed therein by utilizing standard lithography and an anisotropic etching technique that is highly selective in removing the areas of the semiconductor substrate that are unmasked.

Suitable anisotropic etching techniques that can be employed in the present invention in providing the trench include, but are not limited to: ion beam etching (IBE), reactive ion etching (RIE), plasma etching or laser ablation. Of the above mentioned anisotropic etching techniques, RIE is most preferably employed in the present invention.

The semiconductor substrates that may be employed in the present invention include, but are not limited to: silicon (Si), Ge, GaP, InAs, InP, SiGe or GaAs. Of these semiconductor substrates, silicon is most highly preferred in the present invention. The semiconductor substrates employed in the present invention may be of the p-type or the n-type depending on the desired structure being manufactured. They may also contain appropriate diffusion and isolation regions which are embedded in the semiconductor substrate. For clarity, these other regions are not depicted in the drawings of the present invention.

Figure 3B:
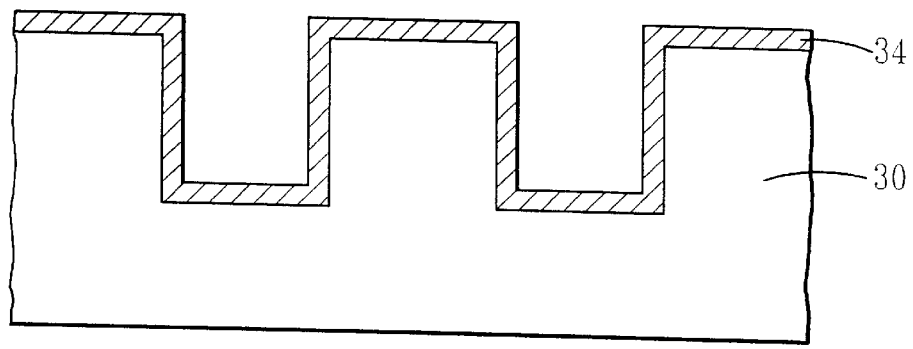

After forming trench regions 32 in semiconductor substrate 30, a conformal layer of dopant source material 34 is formed on the entire surface of the structure including at least one trench region 32 using deposition techniques well known to those skilled in the art. This step of the present invention is illustrated in FIG. 3(b).

Examples of suitable deposition techniques that can be employed in the present invention include, but are not limited to: chemical vapor deposition (CVD), plasma vapor deposition (PVD), enhanced plasma vapor deposition and other like deposition techniques. A highly preferred deposition technique employed in the present invention for providing conformal layer 34 is CVD.

The dopant source material that can be employed in the present invention is any material which comprises a dopant carrier and a dopant element which can be released, i.e. out-diffused, by applying a laser light thereto. Specific examples of dopant carrying materials include polymeric materials that contain repeating Si-containing monomer units. Examples of such Si-polymers that can be employed in the present invention include, but are not limited to: polysilicon, polysilicides, polysilanes, polysiloxanes and the like. Of these materials, it is highly preferred that polysilicon be employed in the present invention since it has an extremely high capability of absorbing laser light and releasing a dopant element therefrom.

As stated above, the material that is deposited as conformal layer 34 also contains a dopant element in addition to the dopant carrying material. The dopant element employed in the present invention is typically one that is different from that which is present in the semiconductor substrate. Thus, for example, when the semiconductor substrate is p-doped, the material layer is doped with a n-type dopant. Examples of n-type dopants include: As, P and Sb. On the other hand, when a n-type semiconductor substrate is employed, the dopant is typically a p-type dopant such as B, Ga and In. Of these dopants, it is highly preferred that the p-type dopant be B whereas the highly preferred n-type dopant is As.

In accordance with the present invention, the dopant source material is a heavily doped material. By "heavily" doped it is meant that the dopant source material used in forming the conformal layer contains a sufficient amount of dopant to allow out-diffusion of from about $1 \times 10^{19}$ to about $1 \times 10^{21}$ atoms/cm$^3$ into the semiconductor substrate.

Figure 3C:
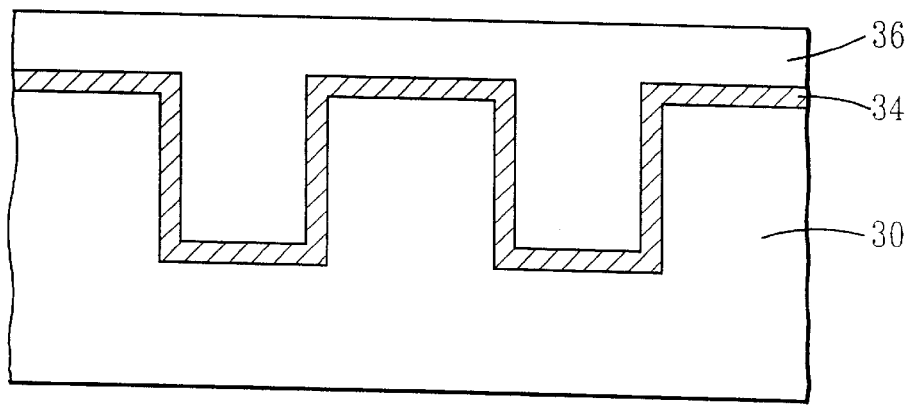

The next step of the present invention which is illustrated in FIG. 3(c) comprises providing a recessable material 36 to the entire surface of the structure covering conformal layer 34 that is within trench 32 as well as outside of trench 32.

The specific type of recessable material employed in the present invention is not critical to the invention as long as it can be selectively removed by recessing. Thus, any of the commonly employed resists including positive tone and negative tone resists may be employed as the recessable material. Alternatively, the recessable material can be an acid sensitive material such as described in U.S. Application Ser. No. 09/127,132, filed Jul. 31, 1998. the contents of which are being incorporated herein by reference. The recessable material, which may be a dry film or liquid, is applied to the structure utilizing standard deposition or coating techniques well known to those skilled in the art including, but not limited to: evaporation, screening, spin-on-coating, PVD and CVD.

Figure 3D:
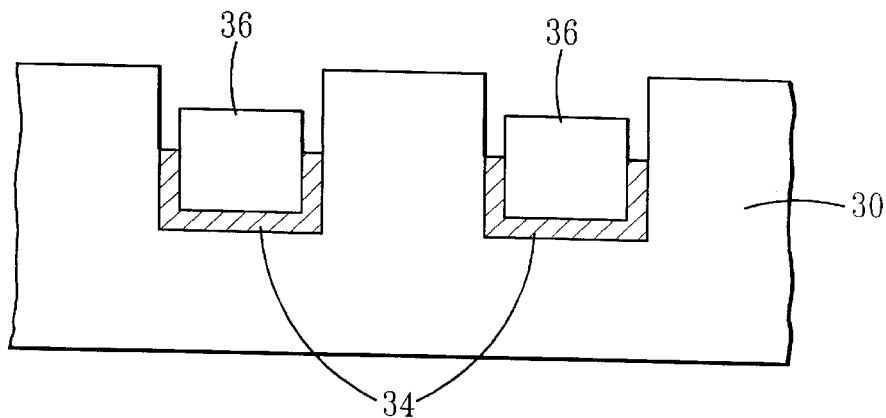

FIG. 3(d) represents the next processing step of the present invention wherein some, but not all, of said recessable material and said dopant source material are recessed from the structure. Any recessing process known to those skilled in the art can be employed in the present invention so long as it is capable of providing the structure shown in FIG. 3(d). Thus, the present invention contemplates isotropic etching as well as acid diffusion.

No matter which recessing technique is employed it must be capable of leaving a plug of recessable material 36 and a layer of dopant source material 34 in said at least one trench region 32. This step thus leaves a masking layer of recessable material 36 on a recessed dopant source material layer.

As stated above, isotropic etching is one recessing technique that can be employed in the present invention to provide the structure shown in FIG. 3(d). Any isotropic etching technique known to those skilled in the art such as wet chemical etching may be employed as the isotropic etching technique.

Additionally, as stated above, recessing may be done utilizing an acid diffusion step. Such recessing is typically carried out when the recessable material is an acid sensitive material. The conditions used in recessing the acid sensitive material are disclosed in the aforementioned co-pending and co-assigned attorney docket No. BU 998001, the contents of which were previously incorporated herein by reference.

Prior to laser annealing the structure, the remaining recessable material not previously recessed is stripped from the trench utilizing standard stripping techniques well known to those skilled in the art. If the recessable material is a resist or an organic, oxygen plasma and ozone down stream ashing may be employed to strip the recessable material.

Figure 5:
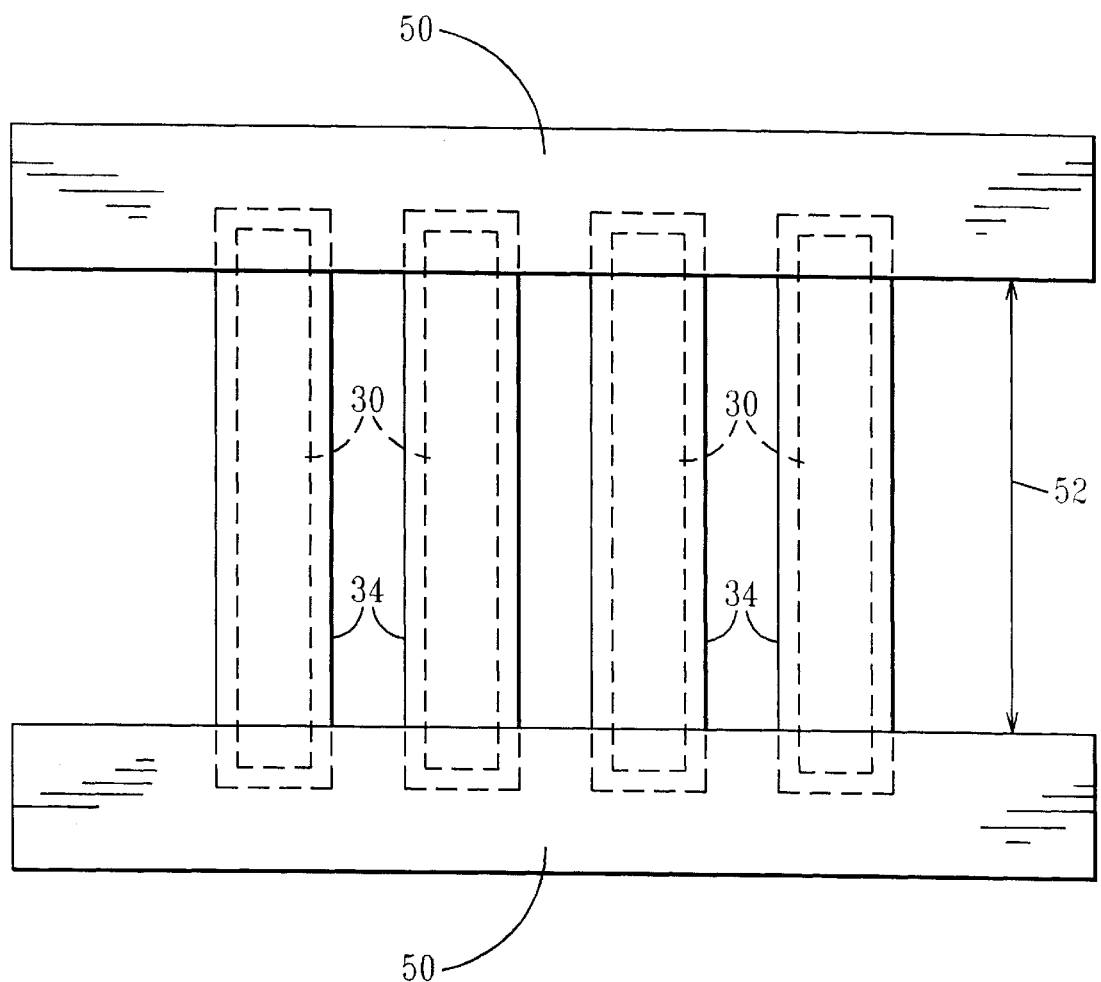
FIG. 5 is a top-bottom view of a masked laser annealing process that can be employed in the present invention.

The next step of the present invention comprises laser annealing the structure not containing any recessed recessable material so as to cause substantial out-diffusion of the dopant element from the recessed dopant source material into said semiconductor substrate. Blanket or masked laser annealing processes are contemplated by the present invention. An example of a masked exposed process is shown in FIG. 5. Specifically, FIG. 5 comprises substrate 30, doped source material 34 and mask 50 which are positioned so as to form a window 52 for laser illumination. In such a process the substrate spaces are masked from exposure to avoid the annealing process at the ends of the substrate loops.

Specifically, the laser annealing step is conducted utilizing a laser source which is capable of generating light having a wavelength of from about 100 to about 450 nm. More preferably, the laser source employed in the present invention is capable of providing light having a wavelength of from about 248 to about 308 nm. It is also emphasized that the laser annealing step employed in the present invention is a multiple pulse laser annealing step. This means that the annealing step is not carried out with a single laser pulse. Rather multiple pulses are employed in the present invention to cause out-diffusion of the dopant element from the dopant source material.

The laser annealing step is also preferably carried out utilizing a laser source that is capable of operating at energies of from about 10 to about 2000 mJ/cm$^2$/pulse. More preferably, the energy of the laser source employed in the present invention is from about 100 to about 400 mJ/cm$^2$/pulse. Commercially available tools exist which can perform such laser annealing, either with or without a mask. The Verdant Technologies laser anneal tool is one example, and it operates at an exposure wavelength of 308 nm.

In addition to employing the above mentioned laser source, the laser annealing step is conducted at a temperature of from about 500° to about 1400° C. for a time period of from about 10 nanoseconds to about 10 milliseconds. More preferably, the laser annealing step is carried out at a temperature of from about 950° to about 1350° C. for a time period of from about 100 nanoseconds to about 1 millisecond. This heating of the substrate is usually accomplished by means of the energy absorbed by the substrate during the irradiation process. In addition, the ambient temperature of the wafer may be controlled separately by heating with a convection oven, infrared irradiation or other means. Similarly, if desired, chilling the substrate to lower temperatures may also be used in conjunction with the laser anneal by employing standard methods known in the art using substrate chucks that contain circulating liquids, e.g. water, or gases, e.g. helium, to establish the desired temperature. Typically, the laser annealing step is carried out in an inert atmosphere including, but not limited to: argon, helium or mixtures thereof.

In one embodiment of the present invention wherein the dopant source material is composed of a plasma polymerized methylsilane and a dopant, oxygen is employed during the laser annealing step so as to convert the remaining polysilicon material into an oxide which is more easily removed by subsequent processing steps.

Figure 3E:
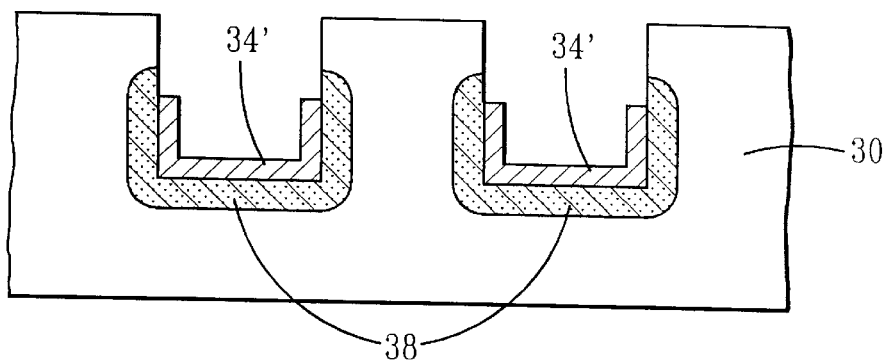

The structure that is provided after laser annealing is shown in FIG. 3(e). Specifically, as is shown therein, laser annealing forms dopant out-diffused regions 38 that are formed in semiconductor substrate 30. It is noted that during laser annealing the dopant element from dopant source material 34 is out-diffused into the semiconductor substrate, leaving behind recessed source material 34'.

Figure 3F:
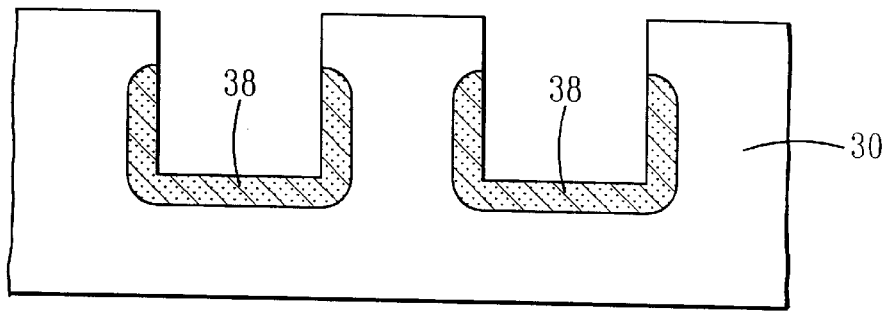

In accordance with the next step of the present invention, which is shown in FIG. 3(f), remaining recessed source material 34' is removed from trenches 32 using standard techniques well known to those skilled in the art. For example, any remaining recessed source material can be stripped by utilizing a wet chemical etchant that is highly selective in removing the remaining recessed source material inside the trench from the structure.

The next processing step of the present invention involves etching some portions of the out-diffused regions under conditions which are effective in forming a buried bitline in the semiconductor substrate. In accordance with the present invention, any anisotropic etching technique such as RIE or plasma etching can be employed in this step of the present invention. The final structure that is fabricated is shown in FIG. 3(g).

Figure 3G:
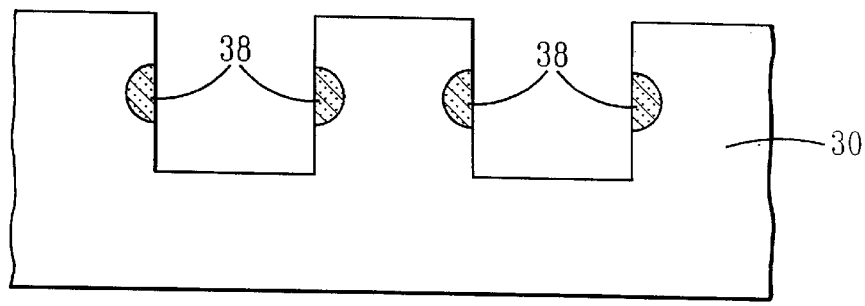

The structure illustrated in FIG. 3(g) can then be subjected to known methods of preparing a vertical gate semiconductor memory structure starting from a gate oxide formation. As stated above, those skilled in the art would know which processing steps are required in making the vertical gate semiconductor memory structure, therefore, a detailed explanation concerning those processing steps is not given herein. A detailed description of the processing steps used in forming the vertical gate electrode semiconductor structure is found in co-assigned U.S. application Ser. Nos. 08/787,419; 08/792,955; 08/792,952; and, 08/787,418, the contents of each are incorporated herein by reference.

Figure 4A:
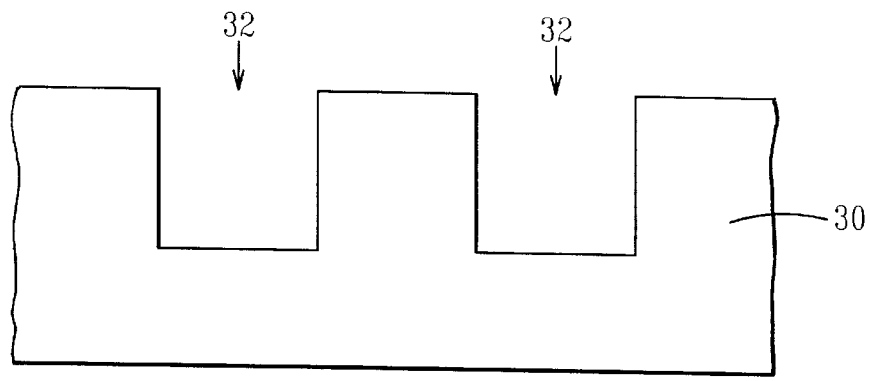
FIG. 4 (a)–4(d) are cross-sectional views of a typically vertical memory cell structure that can be fabricated utilizing another embodiment of the present invention.

The embodiment of the present invention which utilizes ion implantation to create an amorphized region at the bottom of the trench will now be described in greater detail with reference to FIGS. 4(a)–(d). Referring first to FIG. 4(a), there is shown a semiconductor substrate 30 which contains trench regions 32 formed therein as described hereinabove.

Next, the semiconductor material at the bottom of trench region 32 is then rendered substantially amorphous by implanting a heavy ion such as Ge and Si.

Figure 4B:
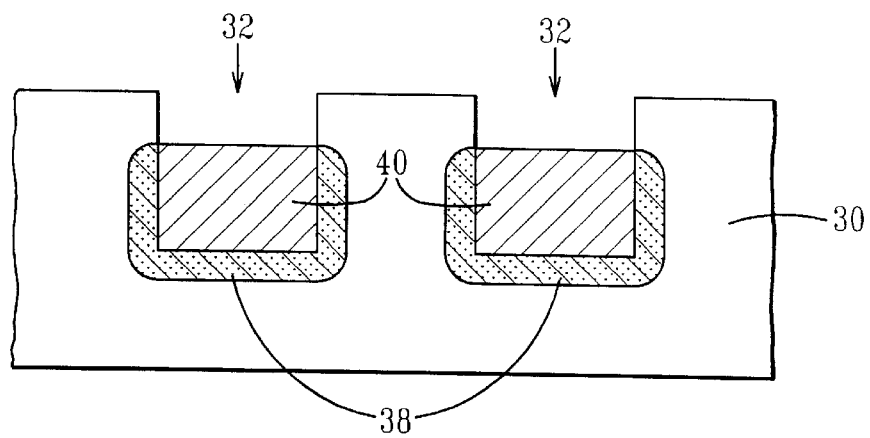

Arsenic, As, can also be employed in the present invention provided that the annealing step is carried out in the presence of an inert atmosphere. A highly preferred ion employed in the present invention for amorphizing the bottom of trench region 32 is Ge. The amorphized regions 40 are shown in FIG. 4(b).

The amorphization step is carried out utilizing a conventional ion beam implanting apparatus that is capable of operating at an energy of from about 10 to about 200 eV, and an) ion dosage of from about $1 \times 10^{13}$ to about $1 \times 10^{16}$ atoms/cm$^2$. More preferably, the ion implantation step is carried out at an energy of from about 40 to about 50 eV, and an ion dosage of from about $0.5 \times 10^{15}$ atoms/cm$^2$.

Figure 4C:
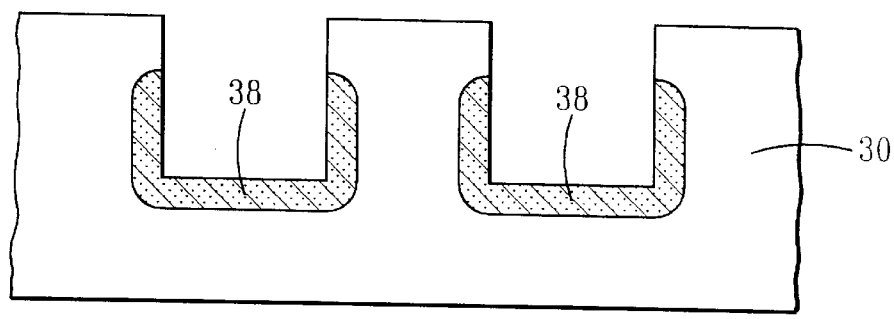
Figure 4D:
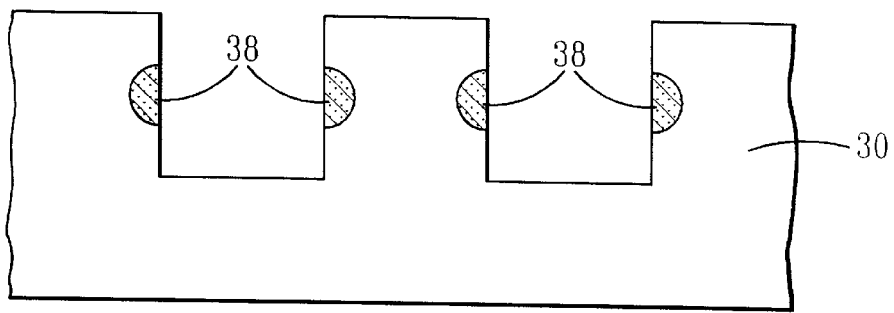

FIG. 4(c) illustrates the structure after laser annealing the same in the presence of a gaseous dopant element. Suitable dopant elements that may be employed in this aspect of the present invention include, but are not limited to: P, As, Sb, B, Ga, In or mixtures thereof. A highly preferred dopant element to use during the laser annealing step is As.

The laser source and conditions used in this embodiment of the present invention is the same as those mentioned hereinabove except that the laser annealing step is conducted in the presence of a gaseous dopant element. The dopant element may be used alone or it may be mixed with an inert gas.

The concentration of dopant that is employed in this embodiment of the present invention is from about $1 \times 10^{19}$ to about $1 \times 10^{21}$ atoms/cm$^3$. More preferably, the concentration of dopant employed in the laser annealing step is about $1 \times 10^{20}$ atoms/cm$^3$.

It should be further emphasized that the conditions used in the laser annealing step are sufficient to form out-diffused dopant regions 38 in semiconductor substrate 30.

After laser annealing in the presence of a gaseous dopant element and subsequent out-diffusion of the dopant element, the out-diffused region is subjected to anisotropic etching as described hereinabove. The final structure containing a buried bitline that is formed using this embodiment of the present invention is shown in FIG. 4 (d).

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

Having thus described our invention, what we claim as new, and desire to secure by the letters patent is:

1. A method of forming a bitline buried below the transfer gate of a vertical semiconductor memory cell, said method comprising the steps of:
   (a) forming at least one trench region in a semiconductor substrate;
   (b) forming a conformal layer in said at least one trench region and on exposed surfaces of said semiconductor substrate, wherein said conformal layer comprises a dopant source material which comprises a dopant carrying material and a dopant element which is capable of being released upon exposure to laser light;
   (c) depositing a recessable material on the structure provided in step (b);
   (d) recessing some, but not all, of said recessable material and said dopant source material leaving a masked region of said recessable material on a layer of said dopant source material in said at least one trench region;
   (e) stripping the recessable material from said trench;
   (f) laser annealing the structure provided in step (e) to out-diffuse the dopant element from the recessed dopant source material into said semiconductor substrate;
   (g) stripping any remaining recessed source material from said at least one trench region; and
   (h) etching the out-diffused region under conditions effective to form a buried bitline in said semiconductor substrate.

2. The method of claim 1 wherein said semiconductor substrate is composed of Si, Ge, SiGe, GaAs, GaP, InAs or InP.

3. The method of claim 2 wherein said semiconductor substrate is Si.

4. The method of claim 2 wherein said semiconductor substrate is doped with a p-type dopant or a n-type dopant.

5. The method of claim 1 wherein said dopant carrying material is composed of polysilicon, a polysilicide, a polysilane or a polysiloxane.

6. The method of claim 5 wherein said dopant carrying material is polysilicon.

7. The method of claim 1 wherein said dopant element is a n-type dopant element or a p-type dopant element.

8. The method of claim 7 wherein said n-type dopant element is As, P or Sb.

9. The method of claim 7 wherein said p-type dopant element is B, Ga or In.

10. The method of claim 1 wherein said conformal layer is deposited by chemical vapor deposition (CVD), plasma vapor deposition (PVD) or enhanced PVD.

11. The method of claim 1 wherein said recessing step is carried out utilizing an isotropic etching process or an acid diffusion process.

12. The method of claim 1 wherein said laser annealing step is carried out in an inert gas atmosphere, oxygen or mixtures thereof.

13. The method of claim 12 wherein said laser annealing step is carried out in oxygen.

14. The method of claim 1 wherein said laser annealing step is carried out with a laser source that is capable of emitting light having a wavelength of from about 100 to about 450 nm and an energy of from about 10 to about 2000 eV.

15. The method of claim 14 wherein said laser annealing step is carried out with a laser source that is capable of emitting light having a wavelength of from about 248 to about 308 nm and an energy of from about 100 to about 400 eV.

16. The method of claim 1 wherein said laser annealing step is a multiple pulse step which is carried out at a temperature of from about 500° to about 1400° C. for a time period of from about 10 nanoseconds to about 10 milliseconds.

17. The method of claim 16 wherein said laser annealing step is carried out at a temperature of from about 950° to about 1350° C. for a time period of from about 100 nanoseconds to about 1 millisecond.

18. The method of claim 1 wherein said laser annealing step is carried out by blanket exposure or by a mask and trim step.

19. The method of claim 1 wherein said stripping step, step (g), includes the use of a wet chemical etchant.

20. The method of claim 1 wherein step (h) is conducted using an anisotropic etching process selected from the group consisting of reactive ion etching and plasma etching.

21. The method of claim 1 wherein said laser annealing step is carried out by blanket exposure or by a mask and trim step.

* * * * *